United States Patent
Ramm et al.

(10) Patent No.: US 10,487,391 B2
(45) Date of Patent: Nov. 26, 2019

(54) OXIDATION BARRIER LAYER

(71) Applicant: Oerlikon Surface Solutions AG, Pfäffikon, Pfäffikon (CH)

(72) Inventors: Jürgen Ramm, Maienfeld (CH); Florian Seibert, Sevelen (CH); Beno Widrig, Bad Ragaz (CH); Doris Fopp-Spori, Landquart (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 15/034,069

(22) PCT Filed: Oct. 31, 2014

(86) PCT No.: PCT/EP2014/002924
§ 371 (c)(1),
(2) Date: May 3, 2016

(87) PCT Pub. No.: WO2015/062733
PCT Pub. Date: May 7, 2015

(65) Prior Publication Data
US 2016/0273093 A1    Sep. 22, 2016

(30) Foreign Application Priority Data
Nov. 3, 2013 (EP) .................... 13005182

(51) Int. Cl.
C23C 14/32 (2006.01)
C23C 14/08 (2006.01)
C23C 14/58 (2006.01)

(52) U.S. Cl.
CPC ............ *C23C 14/325* (2013.01); *C23C 14/08* (2013.01); *C23C 14/081* (2013.01); *C23C 14/083* (2013.01); *C23C 14/5826* (2013.01)

(58) Field of Classification Search
CPC ..... C23C 14/08; C23C 14/081; C23C 14/083; C23C 14/325; C23C 14/5826
USPC ....................... 204/192.38, 298.41
See application file for complete search history.

(56) References Cited

U.S. PATENT DOCUMENTS

| | | | |
|---|---|---|---|
| 5,741,596 A | 4/1998 | Skowronski et al. |
| 6,214,474 B1 | 4/2001 | Barbist et al. |
| 2008/0090099 A1 | 4/2008 | Ramm et al. |
| 2008/0286496 A1 | 11/2008 | Ramm et al. |

(Continued)

FOREIGN PATENT DOCUMENTS

| | | |
|---|---|---|
| DE | 69229513 T2 | 1/2000 |
| EP | 0880607 B1 | 6/2001 |

(Continued)

OTHER PUBLICATIONS

Ramm et al. "Correlation between target surface and layer nucleation in the synthesis of Al—Cr—O coatings deposited by reactive cathodic arc evaporation", Surface & Coatings Technology 205 (2010) 1356-1361.*

(Continued)

*Primary Examiner* — Rodney G McDonald

(57) ABSTRACT

A method for producing an oxidation barrier layer on a workpiece substrate in which the oxidation barrier layer is produced by means of physical deposition from the gas phase (PVD) and is an oxide that is materially related to the uncoated surface of the workpiece.

11 Claims, 10 Drawing Sheets

Illustration of the oxidation process on a steel substrate, which has uncoated regions (1) and a region (2) that is coated with the layer according to the invention. The increase in volume due to the spontaneous oxidation of the steel surface is clearly visible in region (1).

(56) References Cited

U.S. PATENT DOCUMENTS

2009/0191417 A1    7/2009   Ramm
2013/0036942 A1    2/2013   Ramm

FOREIGN PATENT DOCUMENTS

| JP | S6376861 A | 4/1988 |
|---|---|---|
| JP | H05208326 A | 8/1993 |
| JP | 2007196364 A | 8/2007 |
| JP | 2011503350 A | 1/2011 |
| JP | 2011514437 A | 5/2011 |
| JP | 2011152627 A | 8/2011 |
| JP | 2013522058 A | 6/2013 |
| JP | 2013530307 A | 7/2013 |
| WO | 2005051866 A1 | 6/2005 |
| WO | 2008043606 A1 | 4/2008 |
| WO | 2013159870 A1 | 10/2013 |
| WO | 2013159893 A1 | 10/2013 |
| WO | WO 2013/159893 * | 10/2013 |
| WO | 2014111264 A1 | 7/2014 |

OTHER PUBLICATIONS

Technical Specifications Eurofer Material Database.*
D. Levchuk, et al., "Al—Cr—O Thin Films As an Efficient Hydrogen Barrier," Surface & Coatings Technology, May 16, 2008, vol. 202, pp. 5043-5047.
Weizhong Tang, "Thin Film Material Preparation Principle, Technology and Application (2nd Edition)," May 31, 1998, pp. 44-45, Metallurgical Industry Press—also included is an email explaining the relevance of this document.

* cited by examiner

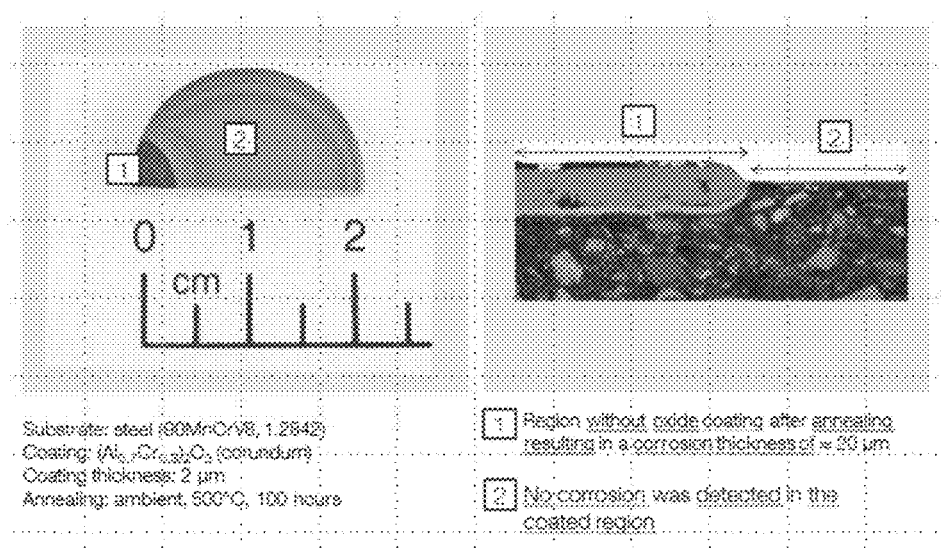
Fig. 1: Illustration of the oxidation process on a steel substrate, which has uncoated regions (1) and a region (2) that is coated with the layer according to the invention. The increase in volume due to the spontaneous oxidation of the steel surface is clearly visible in region (1).

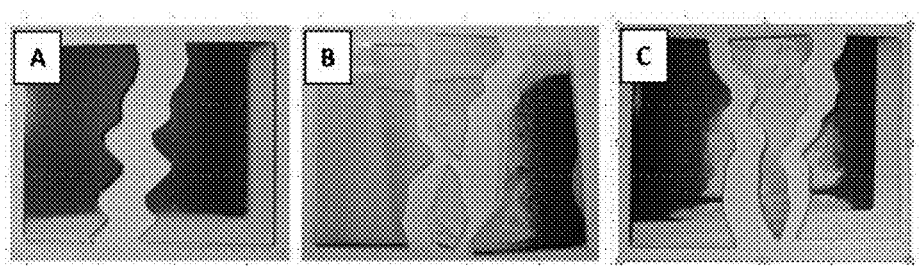
Fig. 2: The aging tests on the Al-Hf layers with different Al-Hf concentrations resulted in the breakage of the sapphire substrate material at temperatures of 690°C (A) and 850°C (B and C).

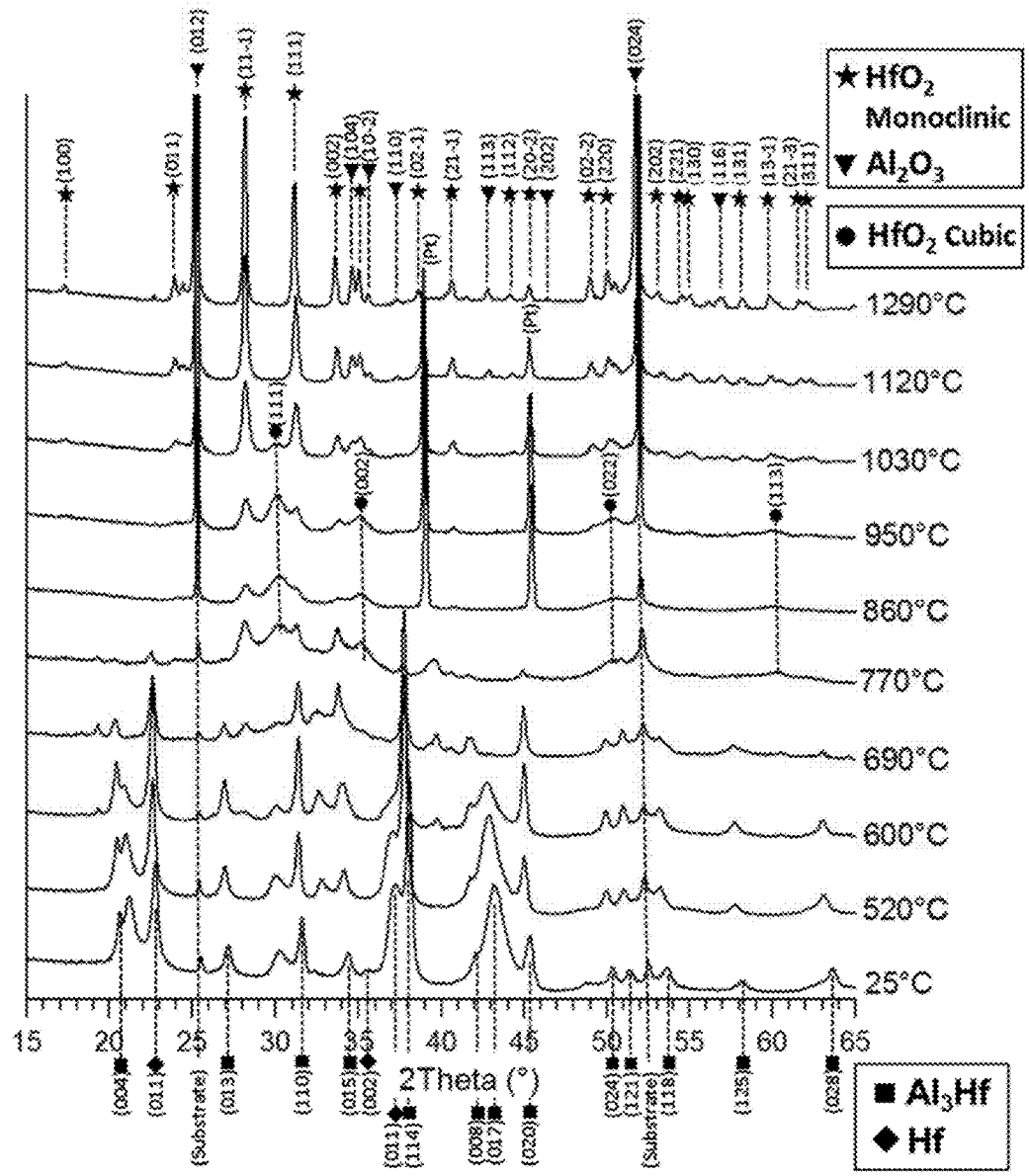
Fig. 3: In-situ XRD measurements on the specimen (B). At the transition between 600°C and 690°C, there is a significant reduction in the intensities of the reflections for the intermetallic compound Al3Hf. Starting at 770°, reflections are simultaneously produced, which can be attributed to the aluminum with a corundum structure, the monoclinic HfO2, and a cubic HfO2.

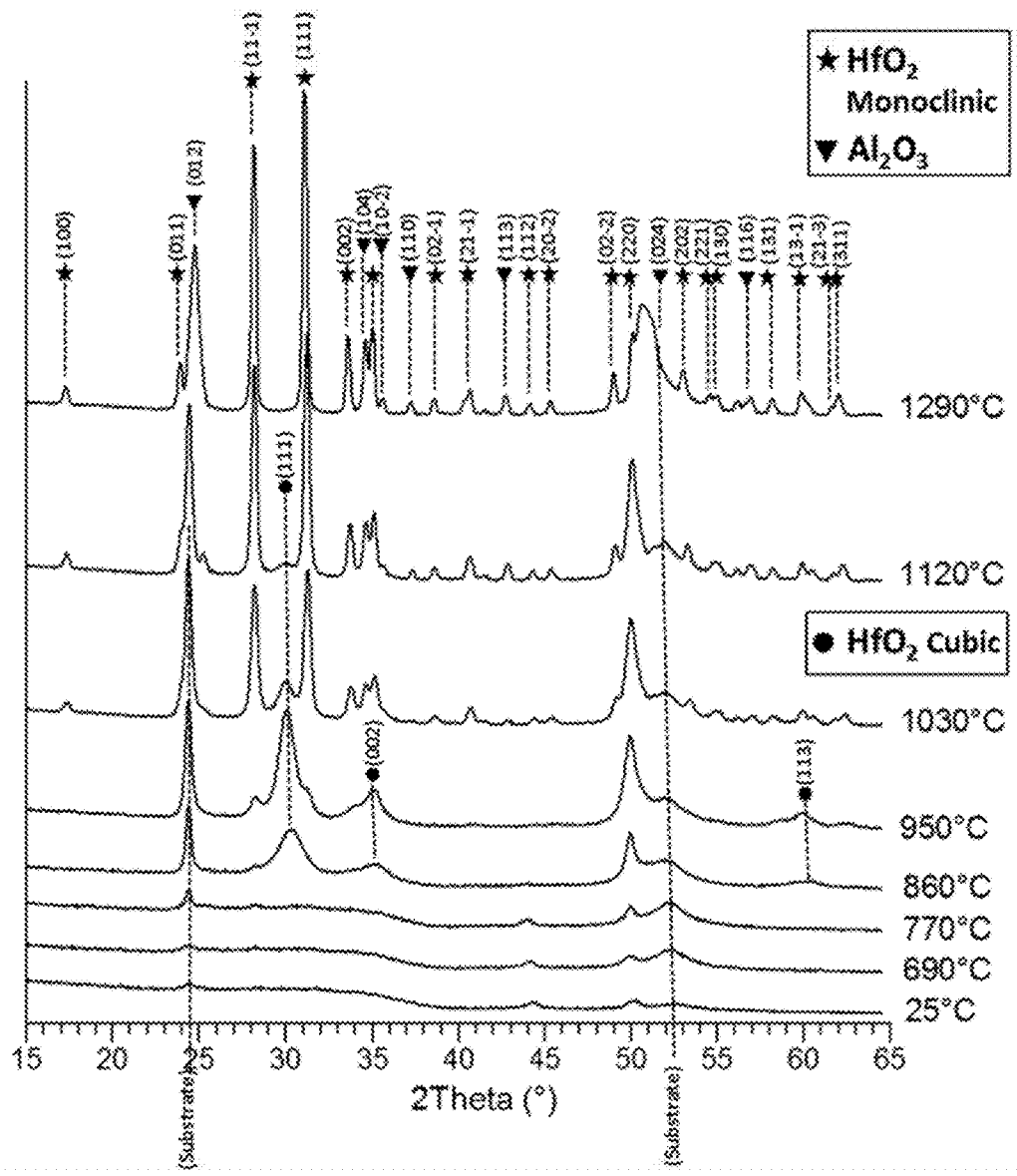
Fig. 4: In-situ XRD measurements on an Al-Hf-O layer, which was synthesized from a target with the composition of 70 at.% Al and 30 at.% Hf. When aged in the atmosphere, the spontaneous oxidation proceeds through the formation of a cubic phase in the range between 860°C and approximately 1030°C. The reflections of this phase in this temperature range are labeled (111), (02), and (113).

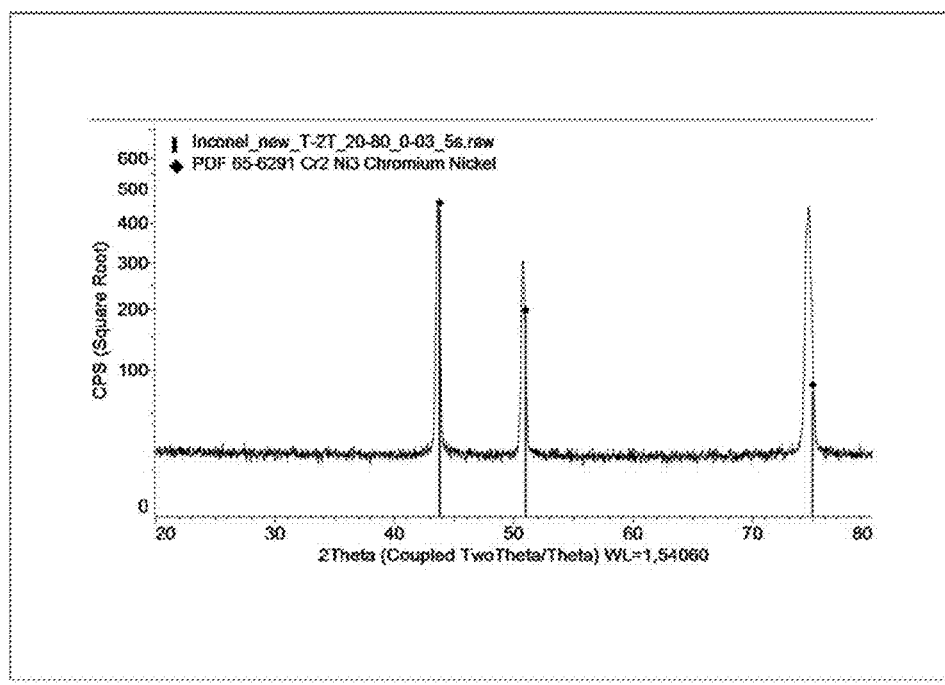
Fig. 5: XRD measurements on an Inconel substrate surface with the locations for an Inconel layer with the composition Cr2Ni3.

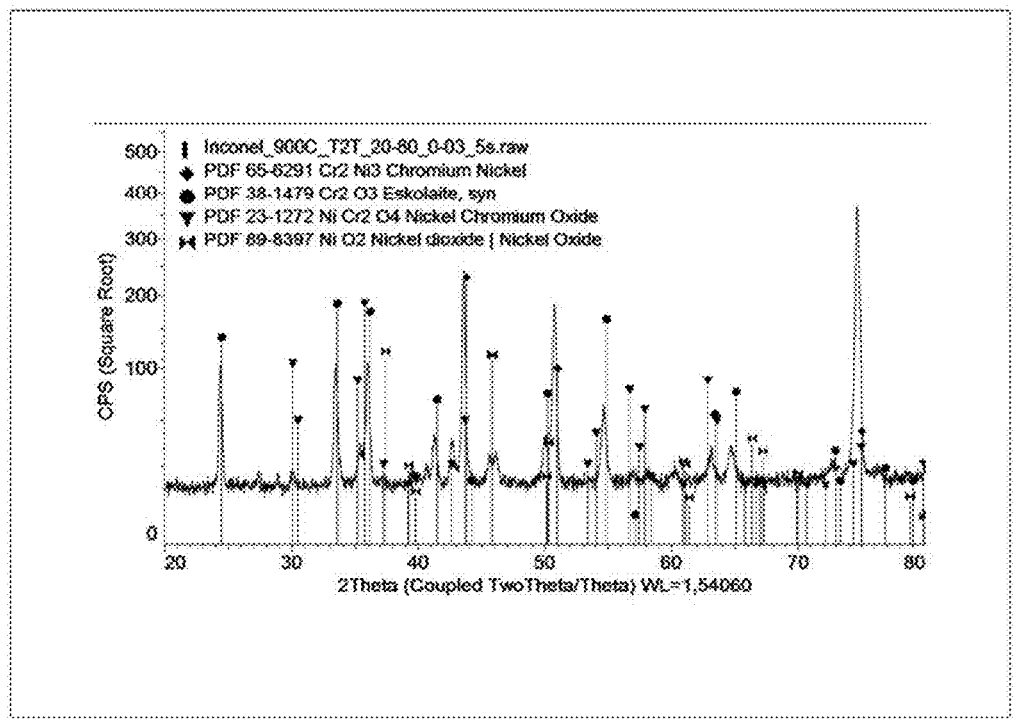
Fig. 6: XRD measurements on an Inconel substrate surface, which was aged in the atmosphere at 900°C for 24 h. The spontaneous oxidation leads to the formation of surface oxides of different crystal structures.

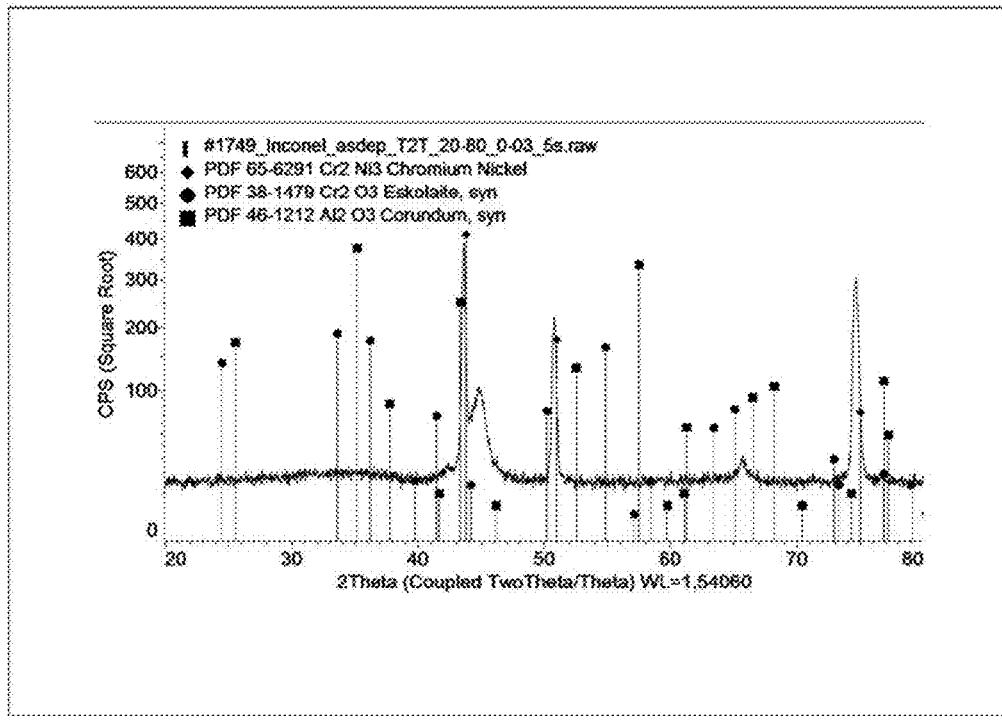

Fig. 7: XRD measurements on an Inconel substrate coated with an Al-Cr-O layer. In addition to the already known characteristic peaks for the Inconel substrate material (PDF 65-6291), the reflections from the database for the Cr2O3 eskolaite (PDF 38-1479) and the aluminum oxide (corundum) (PDF 46-1212) are also plotted in this figure. Since the Al-Cr-O layer was synthesized from target material that was composed of 70 at.% Al and 30 at.% Cr, a layer is expected that has essentially one solid solution oxide in a corundum structure, i.e. whose Bragg reflections lie exactly between those of eskolaite and corundum.

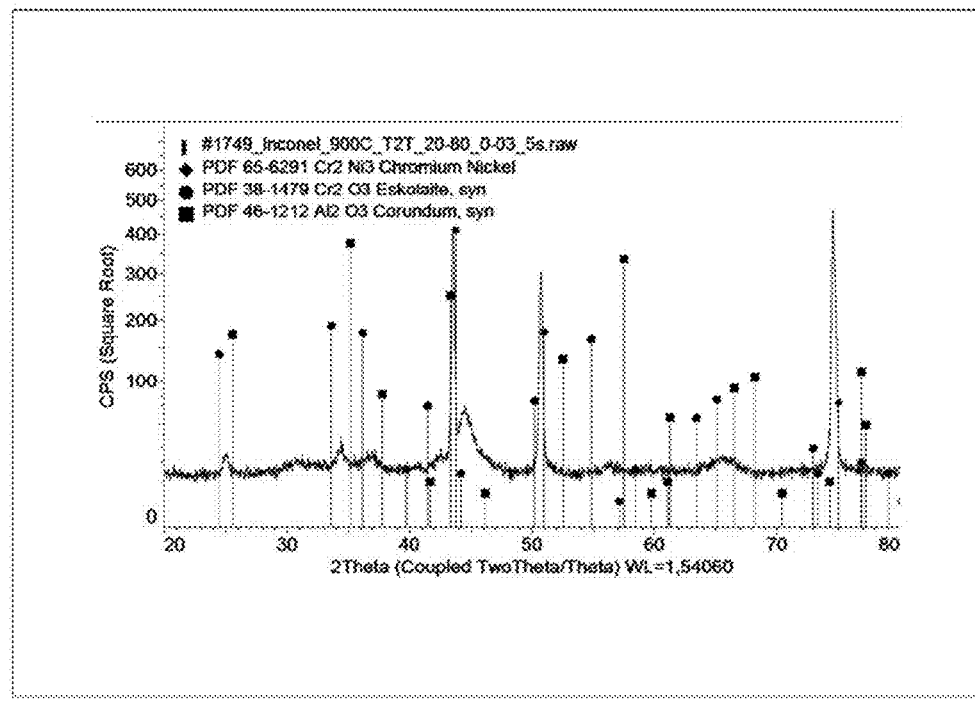
Fig. 8: XRD measurements on the coated Inconel specimen in Fig. 7 after it has been aged in the atmosphere. In addition to the peaks of the Inconel and the above-described peaks of the Al-Cr-O solid solution, other peaks of the solid solution have formed, namely at 2Theta angles of approximately 25°, 34.5°, and 37° and in the vicinity of 65°.

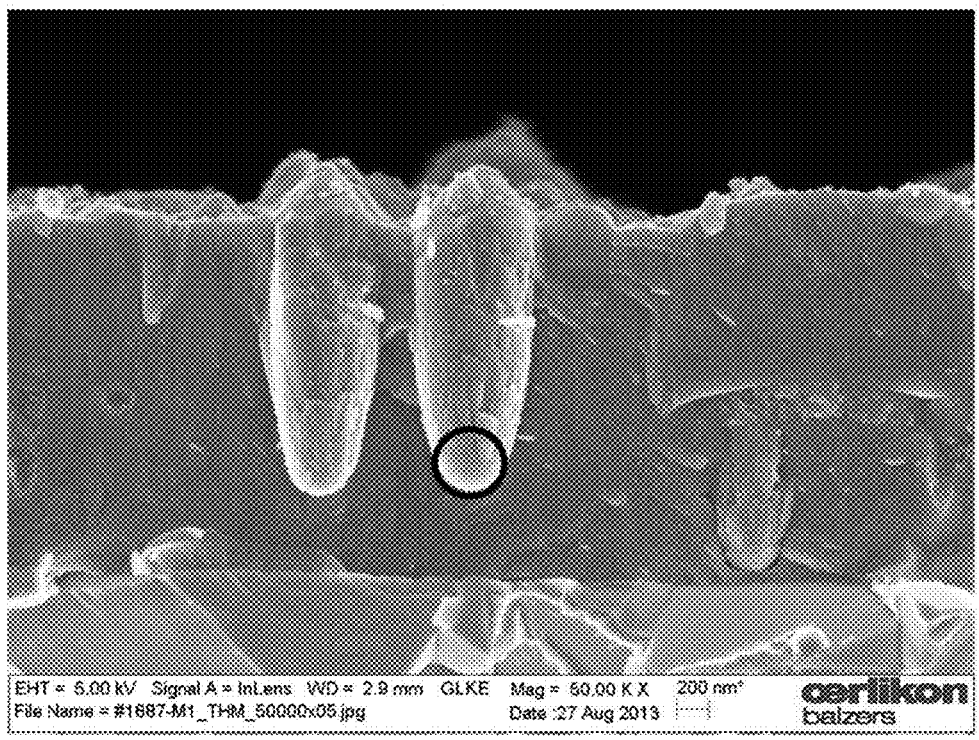
Fig. 9: Al-Cr-O layer with splashes incorporated into the layer. In the two dominant splashes in the middle of the figure, the EDX analysis reveals the cores of the splashes to be essentially composed of Cr (original splash in the photo shown inside the circle). The figure also shows that a layer is growing on the splashes.

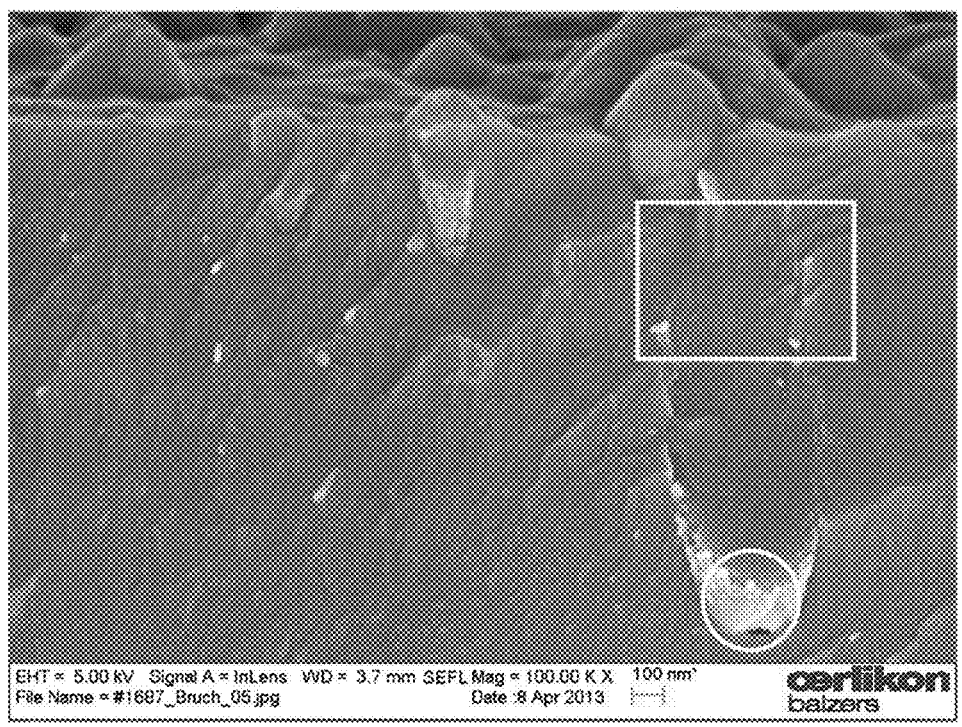
Fig. 10: Al-Cr-O layer from Fig. 9, aged at 900°C for 24 h. The fracture cross-section of the Al-Cr-O layer is shown, with a splash over which a layer has grown (splash core once again circled).

OXIDATION BARRIER LAYER

FIELD OF THE INVENTION

When metallic and sometimes also ceramic surfaces come into contact with oxygen, this usually results in an oxide formation on their surface. The oxidation is promoted by higher temperatures and can be further intensified through additional reactions, for example through the presence of other gases. In many cases, the oxides that spontaneously form on the surfaces are not chemically stable and degrade the mechanical properties thereof. Frequently, these oxides have a porosity or chemical instability, which does not prevent a further oxygen diffusion and the accompanying oxidation of the underlying metal. But even in cases in which the oxide layer formed is embodied as impervious to oxygen diffusion, cyclical thermal loads lead to a breakdown of the formed oxide layer and to detachment thereof from the substrate. The result is a loss of material or in other words: wear on the metallic surface. The invention relates to a thin oxide layer, which is deposited by means of PVD onto the substrate surface that is to be protected and which prevents spontaneous oxidation of the metallic surface and also adheres well under cyclical temperature loads and is mechanically stable.

BACKGROUND OF THE INVENTION

DE69229513T2 has disclosed that it is possible to protect silicon-containing ceramic surfaces from oxidation by means of a silicon oxide layer with an aluminum oxide as an intermediate layer. In this connection, the aluminum oxide intermediate layer is needed as a barrier against oxygen diffusion.

EP0880607B1 describes an oxidation protection layer for high-melting-point materials, which is composed of suicides or aluminides in which a reaction-preventing layer is necessarily provided between the oxidation protection layer and the high-melting-point material. The reaction-preventing layer is an oxide layer, preferably a hafnium or zirconium oxide.

U.S. Pat. No. 5,741,596A discloses an oxidation protection layer for metallic substrate surfaces. The oxidation protection layer is composed of three different layers; the first layer contains essentially mixtures of oxides, the second layer is composed of aluminum oxide and silicon carbide, and the third layer closest to the surface is composed of silicon oxide and admixtures of other oxides and silicon carbide. In addition to the oxidation protection effect, this layer should also have higher emittance and reduced catalytic activity.

WO2005051866A1 discloses an oxidation barrier for silicon-containing ceramics, which are used in was turbines and which are exposed to hot gases with high percentages of water vapor. Without oxidation protection, oxide formation occurs on the surface of silicon nitride-based and silicon carbide-based ceramics, which results in a loss of material due to erosion. The protective coating is composed of a diffusion barrier coating, another layer serving as an oxidation barrier made of scandium disilicate, another layer that protects against environmental influences composed of titanium oxide and scandium silicates and -oxides, and finally a thermal protective coating that contains stabilized zirconium oxide. This application describes that the different layers are necessary on the one hand to prevent oxygen diffusion into the substrate and on the other hand, to avoid the formation of a mechanically unstable oxide on the surface. It also refers to the problem that for example a thin oxide composed of $SiO_2$ constitutes a good diffusion barrier, but it must be thin enough so that cracks do not form in this layer. In principle, this patent very clearly describes the complicated set of problems involved in optimizing an oxidation barrier layer and the complicated interrelationships that must be taken into account when adapting mechanical properties of protective coatings to one another and how their different oxidation capacities must be taken into account so that an effective and stable oxidation protection layer can be achieved.

DISADVANTAGES OF THE PRIOR ART

Design of the oxidation barrier layer depends significantly on the material to be protected Generally, the oxidation barrier layer requires even more layers, which are used for adaptation The oxidation barrier does in fact often take on the barrier properties, but does not exhibit enough mechanical stability and thermal barrier action In accordance with the complexity of the layer system that contains the oxidation barrier, the production methods are correspondingly complex and economically costly.

The object of the invention is to find an oxidation barrier in the form of a thin layer that is significantly simplified in comparison to the prior art and that protects both metallic and ceramic surfaces from oxidation and the accompanying wear. The oxidation barrier should meet the following, requirements:

1. Chemically stable compound in oxygen-containing atmospheres for very high ambient temperatures, i.e. above 800° C., preferably above 1000° C., and particularly preferably above 1200° C.
2. Barrier properties with regard to oxygen transport in order to avoid oxidation of deeper substrate regions, thus preventing the occurrence of density changes in deeper regions of the substrate or set of layers, which could lead to a resulting mechanical failure of the set of layers or substrate surface.
3. Mechanically stable chemical compound in layer form, which in addition to a high hardness at high temperatures also has good wear properties.
4. Good adaptability of the oxidation barrier layer to the substrate or to other possible protective layers with regard to the stability of the layer or of the set of layers with regard to thermal cycles.
5. Economical production method of the oxidation barrier layer, suitable for a large number of substrate materials, i.e. the fact that, for example, the process temperatures can be adapted to the substrate material.
6. Production method should be easy to combine with the production of other materials, particularly in the form of thin layers.

In general, the protection of metallic and ceramic surfaces is an important application field for oxidation barrier layers. This protection is particularly important, however, for materials that are used at high temperatures. In metallic substrates, these include, among other things, high-temperature alloys such as Ni-based alloys, intermetallic compounds (e.g. Laves phases or some Ni-, Fe-, and Ti-aluminides) as well as some solid solution compounds. Such compounds have been and are being developed in order, for example, to ensure high mechanical strengths at high temperatures, in other words to increase the yield strengths of the material, for example.

In high-temperature alloys, such improvements with regard to the mechanical properties are achieved through the addition of suitable alloying and doping elements, which contribute to the solidification of the raw material. These alloying elements and doping agents make it possible, for example at high temperatures, to increase the formation of intermetallic compounds from the alloy or certain solid solution formations that increase the temperature resistance. These phenomena are known to the person skilled in the art by the terms solid solution hardening, precipitation hardening, and dispersion hardening. In addition to the goal of achieving better mechanical properties at high temperatures, however, there is also another reason that these alloying elements or doping agents are added to the base elements. The aim is to increase the oxidation resistance of the metallic material. The alloying with for example Al, Si, Cr, or rare earths is thus also carried out with a view to the fact that an oxide of these elements automatically forms at the high temperatures and this then functions as a protective oxide that protects the rest of the base material from further oxidation. Naturally in this connection, it is desirable if as much as possible, only the stable oxide or a stable oxide of the base material forms on the surface. In other words, what is sought is a selective oxidation of the material surface to produce the most stable oxide. The formation of the surface oxide (so-called "scaling") depends on many factors: temperature, ambient conditions, the current bonding state of the elements (whether alloyed, in the form of an intermetallic compound, or solid solution), the chemical composition of the metallic surface. It is therefore not surprising that it is difficult to predict the protective action of such an oxide for a specific application field and such an oxide can hardly be expected to cover a wide range of application fields. In general, it can be said that with alloying or doping and the resulting complexity of the composition, the behavior also changes at high temperatures. Depending on the conditions, the oxidation of the alloys can occur selectively, complex oxides can form, and/or internal oxidation by means of diffusion processes can occur. All of these processes take place rapidly at high temperatures and are essentially non-linear, i.e. are difficult to adapt to one another. In addition, it is also difficult to guarantee a good adhesion of such a "naturally" formed oxide to the metallic base. But this is a necessary requirement in order to avoid the erosion of the surface oxide if it is subjected to mechanical loads. One concept for improving this adhesion lies in doping the high-temperature material with rare earths (Y, Ce, La). This naturally once again increases the complexity of the oxidation process and oxide formation in the processes at high temperatures.

Despite this set of problems, high-temperature alloys have already gained acceptance in many engineering fields. Examples of these include the Ni-based alloys, which are known by trade names such as Nimonic, Inconel, Hasteloy, to mention only a few. For example, the high-temperature resistant material NiCo20Cr15Mo6AlTi (2.4634) is used in gas turbine blades and the superalloy NiCr20TiAl (Nimonic80A, 2.4631) is used in outlet valves for large diesel engines.

Like the alloys, the intermetallic compounds produce a protective oxide in an oxidative environment. The requirements for an intermetallic compound to produce an effective protective oxide are explained in detail in H. J. Grabke and M. Schütze "Oxidation of Intermetallics," Wiley-VCH, Weinheim, 1998, pages 15 and following. The selective oxidation, one example of which is the oxide growth on intermetallic compounds, is determined on the one hand by the growth rates of the respective oxide. Consequently, only oxides with low growth rates also offer sufficient protection from oxidation. Aluminum oxide and silicon oxide, for example, have lower oxide growth rates than, for example, titanium oxide, chromium oxide, or nickel oxide. The oxidation, however, must yield a continuous coating, on the substrate, i.e. the composition of the intermetallic compound must be selected so that the percentage of aluminum, for example, is high enough to guarantee a closed layer despite the low oxide growth rate. In Ni—Al-based intermetallic compounds, this protective oxide is preferably composed of aluminum oxide. The formation of such a protective layer of aluminum oxide, however, depends on additional parameters, for example the chemical composition. Whereas NiAl, for example, forms a protective layer of aluminum oxide throughout the entire temperature range (according to Doychak, cited in Grabke, page 19), for Ni3Al, this is only true for temperatures above 1200° C. The process of oxidation is different for the different intermetallic compounds; this means that for NiAl, a closed aluminum oxide layer can in fact be produced on the surface, but Ti3Al, for example, is eroded much more quickly because a pure aluminum oxide protective layer is not formed, but instead a mix of (rutile) titanium dioxide and aluminum oxide is formed.

Similar to what happens with high-temperature alloys, in order to achieve a long-lasting protection for example by means of an aluminum oxide, it is also necessary for this oxide to have a good adhesion, especially if it is subjected to temperature cycles, as is the case in many applications. Such cases even require particularly good adhesion of the protective oxide to the substrate. A requirement for this is adapted temperature coefficients between the protective oxide and the substrate. Such an adaptation, however, is difficult to influence in many cases because with the intermetallic compounds, the protective oxide is formed via the selective oxidation and this is predetermined by the predetermined chemical composition of the intermetallic compound. Consequently, with the chemical composition predetermined by the intermetallic compound, the protective action of the oxide formed cannot be expected to be optimal at all. Usually, a sufficient oxidation protection is not even achieved, which results in a continuous erosion of the base material. Another set of problems lies in the fact that the oxidation process of the base material (substrate) depends on the temperature and the ambient conditions. It is quite possible that a barrier effect for is achieved for ranges between 600 and 800° C., but that this protective action no longer exists for temperature ranges above 1000° C., either because the oxides formed are no longer stable or because diffusion processes due to the oxide in the substrate material lead to density changes and thus to the mechanical weakening of the substrate surface.

That which has already been said above with regard to high-temperature alloys and intermetallic compounds is also entirely applicable in analogous fashion to solid solution compounds.

SUMMARY OF THE INVENTION

The present invention discloses a method for producing an oxidation barrier layer on a workpiece substrate in which the oxidation barrier layer is produced by means of physical deposition from the gas phase (PVD) and is an oxide that is materially related to the uncoated surface of the workpiece.

Preferably, the PVD method is a cathodic arc deposition method.

Preferably, the method is carried out in such a way that the oxidation barrier layer includes an Al—Cr—O layer.

The PVD method that is used according to the present invention for producing the oxidation barrier layer can be as cathodic arc deposition method, which is carried out in such a way that the deposited oxidation barrier layer includes splashes.

A method according to the present invention can also include a step in which the synthesized oxide layers undergo a post-oxidation in the plasma or another post-oxidation.

At the same time, the present invention also discloses a workpiece substrate with an oxidation barrier layer that is produced by means of PVD; the oxidation barrier layer is an oxide that is materially related to the uncoated surface of the workpiece. According to preferred embodiments of the present invention, this oxide layer, as explained above, can contain splashes and/or at least one Al—Cr—O layer.

BRIEF DESCRIPTION OF THE DRAWINGS

FIG. 1 is an illustration of the oxidation process on a steel substrate, as obtained in Example 1.

FIG. 2 shows aging tests on Al—Hf layers with different Al—Hf concentrations, which resulted in the breakage of sapphire substrate material, as described in Example 2.

FIG. 3 shows in-situ XRD measurements on one of the specimens (B) in FIG. 2, as described in Example 2.

FIG. 4 shows in-situ XRD measurements on an Al—Hf—O layer, as described in Example 3.

FIG. 5 shows XRD measurements on an Inconel substrate surface, as described in Example 4.

FIG. 6 shows XRD measurements on the Inconel substrate surface of FIG. 5 after aging, as described in Example 4.

FIG. 7 shows XRD measurements on an Inconel substrate coated with an Al—Cr—O layer, as described in Example 4.

FIG. 8 shows XRD measurements on the coated Inconel specimen of FIG. 7 after aging, as described in Example 4.

FIG. 9 shows an Al—Cr—O layer with splashes incorporated into the layer, as described in Example 5.

FIG. 10 is an image of the Al—Cr—O layer of FIG. 9 after aging, as described in Example 5.

DETAILED DESCRIPTION OF THE INVENTION

Two examples should provide clear illustration of the set of problems to be solved. In this connection, it is necessary to demonstrate the restrictions that apply to the protective oxide formation, which is based on selective oxidation, i.e. the spontaneous growth of oxide on the base material.

1. Example: Oxidation of a Steel Surface

FIG. 1 shows the oxide formation on a steel surface when aged in the atmosphere. This specimen was partly (region 2) covered with a layer according to the invention, while other regions (1) of the specimen remained uncoated. Then the specimen was heated to 500° C. in a furnace in the ambient atmosphere and left at this temperature for 100 h. Then, a polished cross-section of the specimen was prepared in order to inspect the region in the transition between the uncoated region (1) and the coated region (2) under the light microscope. The microscope image shows that during the 100 h, an oxide (rust) approximately 20 µm thick has formed in the uncoated region 1 while in the coated region (2), which is covered with a layer according to the invention that is approximately 2 µm thick, there is no visible surface change, i.e. the layer according to the invention effectively protects the steel surface from oxidation. The microscope image also shows other things. For one, the oxide growth is connected with an increase in volume. The oxide grows down into the substrate and up out of the substrate, i.e. once the oxide has grown, it does not prevent a further penetration of the oxygen into the substrate and the therefore continuous oxidation underneath the oxide layer once it has formed. The spontaneously produced oxide on the steel substrate therefore does not constitute oxidation protection for this steel. The coated region (2) behaves in a totally different way. On the one hand, no oxide growth is visible here (not even with further optical enlargement) and on the other hand, there are also no signs of a diffusion of the oxygen through the layer according to the invention. Region (2) thus meets important requirements for a good oxidation barrier:

No oxide growth and the accompanying changes in the material volume

Oxygen is prevented from penetrating into the substrate and thus no oxide forms underneath the layer according to the invention.

2. Example: The Behavior of Al—Hf Intermetallic Compounds when Heated in a Normal Atmosphere Up to 1290° C.

An Al—Hf layer is synthesized by means of cathodic arc deposition. The analysis of the layer (A) by means of EDX revealed a chemical composition of 37 at. % Al and 63 at. % Hf. The oxygen content was estimated at a few percent, which was solely attributed to an oxidation that occurred due to the fact that the layer surface was exposed to a normal environment (verified by means of RBS). The analysis of the crystalline phases of (A) was carried out by means of XRD and revealed that the layer is composed of the Hi phase and the intermetallic phases primarily of Al3Hf and, to a small degree, Al2Hf. The presence of other amorphous phases cannot be excluded, but cannot be determined with this method. The layer was deposited onto a sapphire substrate in order to assure a thermally stable base for baking tests. The aging tests were carried out in the atmosphere and the intent was to study temperatures in the range from room temperature (RT) to 1200° C. It turned out, however, that the substrate broke apart at a temperature of 690° C. (FIG. 2). Baking tests were also carried out for the different layer compositions of Al0.59Hf0.41. (B) and Al0.67Hf0.33 (C) in order to test whether a possibly higher Al content could solve the problem of mechanical instability. For these layer compositions, the crystalline phases were verified by means of XRD. In addition to the metallic Hf, the phases Al3Hf and Al2 Hf were once again found. Since the concentration of Al in the layers was increased, the phase fraction correspondingly shifted toward the more Al-rich Al3Hf. Despite the higher Al fraction, the aging tests did not correspond to expectations and produced a result that was qualitatively similar to that of the first specimen. With a temperature of approximately 850° C., the sapphire substrates broke in both cases (FIG. 2). There was reason to suspect that the oxide growth on or in the intermetallic compounds and the accompanying volume changes resulted in the breakage of the substrate. To confirm this suspicion, the oxidation processes in the Al—Hf layers were then tested in greater detail by means of in-situ XRD measurements (FIG. 3). The tests shown here were carried out on the Al0.59Hf0.41 layer (B). The layer deposited on the sapphire substrate at a substrate temperature of approximately 550° C., in addition to the characteristic sapphire substrate reflections (labeled as the substrate in the figure) at 2Theta of approximately 25.7° and approximately 52.6°, merely exhibits other reflections of the intermetallic compounds Al3Hf and Al2Hf and the metallic Hf. The peaks of Al2Hf are very weak and were not shown in the figure in order to preserve clarity. This layer was then heated in the atmosphere in steps of 5° C./min and then the XRD analysis was carried out at the indicated temperatures. This measuring procedure took 15 minutes each time. The results reveal the following. At the transition between 600° C. and 690° C., the reflections for the intermetallic compound Al3Hf experience a significant reduction in their intensities. Starting at 770°, reflections are produced that can be attributed to the aluminum with a corundum structure, the monoclinic HfO2, and cubic HfO2. With the production of these phases, the Hf reflection increasingly disappears. In other words, these measurement results support the oxidation of the Hf and intermetallic compounds, in fact through the formation of a cubic phase of HfO2. While the intensities of the reflections for aluminum oxide and monoclinic HfO2 increase or remain stable with the temperature, the reflections of cubic. HfO2 disappear at approximately 1120° C. These measurements reveal the following:

- A significant oxidation of the layer begins between 600° C. and 700° C. This oxidation process changes the layer until approximately 1120° C. The failure of the substrate, as shown in FIG. 2, therefore occurs in this range and can be explained by the oxide growth and the accompanying volume changes.
- The disappearance of reflections of the intermetallic compounds and of the Hf shows that the oxidation penetrates into the depth, i.e. that the oxides produced do not form a diffusion barrier with regard to oxygen, particularly in the lower temperature range.
- A gradual oxidation occurs, probably through the formation of a cubic phase of the higher-melting metallic element in the material system, namely Hf.
- Apart from the transition phase, two oxide phases are produced, which have correspondingly different properties with regard to density and stability and therefore also have different mechanical strengths.

This result illustrates the set of problems mentioned at the beginning and emphasizes once again how important it is to control the oxidation process on the surface of intermetallic compounds, solid solutions, and alloys, particularly if, in addition to the application-specific wear processes, the oxides are also subjected to temperature cycles with the accompanying mechanical loads. The control includes both avoiding oxidation on the surface of the substrate that is to be protected and in this connection, also preventing oxygen diffusion into the substrate.

A first object of this invention is to deposit a protective layer onto a high-temperature alloy, intermetallic compound, or solid solution compound, which layer remains mechanically stable at high temperatures in an oxidizing environment and sharply reduces or prevents oxygen diffusion into the substrate.

The next example shows a first embodiment approach, which specifically relates to the substrate material and is already able to attain the object in a few instances.

3. Example: Coating with a Materially Related Oxide Layer

After demonstrating that a spontaneous and selective oxidation on the surfaces of alloys, intermetallic compounds, and solid solutions can result in their mechanical destruction, in another step, layers are tested that have already been deposited in oxide form. Since the problem is to protect an alloy or intermetallic compound of a particular chemical composition, the materially related System Al—Hf was once again selected for the protective oxide to be tested in order to thus synthesize the corresponding oxide. The method of cathodic arc deposition was once again used to produce the layer; this time, the Al—Hf targets were operated in the oxygen reactive gas, with a substrate temperature of 550° C. during the coating process. An Al—Hf—O layer was tested, which was obtained from a target with the composition of 70 at. % Al and 30 at. % Hf. The synthesized layers were tested for chemical composition, which revealed that they were oxides that have a composition of the metallic fractions similar to that of the target composition used. The oxygen content of these layers corresponded approximately to that of a complete oxidation, taking into account the oxide phases that also formed after the aging. Once again, XRD tests were performed on these oxide layers during the heating in the atmosphere. FIG. 4 shows the XRD spectra as a function of the temperature. These measurements reveal the following. At room temperature, at an angle 2Theta of approximately 50.5°, there is a reflection that can be attributed to monoclinic HfO2. There is also a background signal in the range of 2Theta less than 35°. At 770°, the crystallinity of the HfO2 increases and peaks appear for the aluminum oxide (corundum structure); it is not possible to clearly discern whether these should be attributed to the sapphire substrate or the layer. At 860° C., the crystallinity of both corundum and HfO2 increases and it must be assumed that the peak at a 2Theta of 24.5° does in fact have to be attributed, to the layer. In addition, reflections (002) and (113) appear, which can be associated with a cubic phase of the HfO2 (labeled in the figure). But at 1030° C., these transition into the monoclinic HfO2 phase. At this temperature, the reflections for aluminum oxide (corundum) and monoclinic HfO2 are already clearly visible and a further temperature increase to 1290° C. merely results in an improved crystallinity of these phases.

The sapphire substrates with these oxide layers did not exhibit any tendency to break, i.e. the incorporation of the oxygen into the intermetallic Al—Hf layer; in other words, the synthesis of a layer of Al—Hf oxide on the substrate surface mitigated the problem of mechanical instability. It is clear to the person skilled in the art that for practically all high-temperature alloys and intermetallic compounds, materially related oxides can be produced by means of reactive cathodic arc deposition. It is thus possible to avoid or at least mitigate the problem of mechanical instabilities that arise due to the oxide growth on the substrate surface. The tests were also carried out with comparable results on a series of other materials. In every instance, significant improvements with regard to the mechanical stability could also be observed due to the favorable adhesion of the oxide layers to the respective base materials. To name a few examples, alloys such as Inconel were coated with a Ni—Cr—O layer or intermetallic compounds based on Al—Ni, Al—Fe, and Al—Ti. Another advantage of this oxide coating is the freedom of choice with regard to the composition of the metallic components. This makes it possible within a certain range to increase the fraction of the metallic element that is expected to yield a more stable oxide phase in order to thus increase the fraction of this oxide phase in the layer and to achieve better oxide barrier properties and nevertheless remain within the materially related system. Such an embodiment can also have economic advantages, for example when intermetallic thin layers are deposited, and then the same targets can be used for the synthesis of the oxide protection layer.

In summary, it can be stated that oxide layers, which are materially related in their metallic components and have the metallic components on the surface of the substrate, constitute a first embodiment.

For the purposes of the present invention, an oxide is described as materially related to an uncoated surface of a workpiece if it at least mainly, but preferably essentially, contains the same metallic components that are also found in the uncoated surface of the workpiece. The metallic fractions can, however, also be present in the materially related oxide in different concentrations than is the case in the uncoated surface of the workpiece.

Although this embodiment approach does contribute to a considerable improvement in the mechanical stability and barrier properties, which is also the reason why it constitutes a first aspect of the invention, it involves an aspect that could be improved. The oxide layers are generally based on an oxide layer that is multiphase. This is inevitable in most cases, if one wishes to produce the oxide layer from the same metallic components of which the base material is also composed. And this is also quite logical if the intent is to reduce diffusion processes in order to thus improve the mechanical stability of a substrate surface. Under extreme conditions (temperature cycles, high temperatures), though, multiphase oxides still involve the risk that due to crystallization (formation of larger crystallites) and due to a possible post-oxidation of small metallic layer fractions and the accompanying density changes, cracks in the layer can occur, thus diminishing the mechanical and oxide barrier properties.

Another object of this invention is to deposit a hard, temperature-resistant layer on a metallic surface, in particular on the surface of alloys, intermetallic compounds, and solid solutions, which layer prevents the oxygen transport into the underlying surface.

Only impermeable layers can meet these requirements. According to the invention, this can be achieved in that a layer is produced, which is self-sealing with regard to the oxygen diffusion, so that under the influence of oxygen, for example the diffusion of the oxygen along the grain boundaries is inhibited, and in that any metallic particles of a material, which does not completely oxidize, for example in the way that metallic splashes in an oxide layer automatically seal themselves off from oxygen transport.

According to the invention, the layer can be deposited onto the respective substrate surface in an "adapted" way, i.e. with excellent adhesion at room temperature at the high temperatures that occur during operation.

Another object of this invention is for the material of which the oxidation protection layer is composed to change only to an insignificant extent when it is exposed to high temperatures, i.e. for little or no changes in the density to occur when it is exposed to thermal cycles, and for the heating to cause little or no phase separations.

Another object of this invention is for the oxidation protection layer to prevent a "scaling," i.e. an automatic selective oxide growth on intermetallic compounds.

According to the invention, the oxidation barrier layer can be applied so that the oxidation barrier layer itself constitutes a "scaling" that has the same crystal structure as the oxidation barrier layer and merely has an altered chemical composition.

The objects are attained according to one embodiment of the present invention in that Al—Cr—O layers in a predominantly corundum structure are deposited onto the above-mentioned surfaces by means of a FYI) method, preferably a reactive cathodic arc deposition method.

It is known to coat substrates with Al—Cr—O layers by means of reactive cathodic arc deposition (e.g. see WO2008/043606). It is also known that the lattice parameters of this solid solution structure are essentially stable up to 1100° C., i.e. this solid solution layer remains essentially stable with regard to its crystal structure even at high temperatures. WO20081043606 also describes that the Al—Cr—O layer lends the TiCN layer underneath it thermal and oxidative resistance. This was attributed to a reaction zone that forms on the Al50Cr50O 3 layer after the aging in the atmosphere at 1000° C. and for which a thickness of 32 nm was estimated. The extent to which such an oxide layer provides protection from oxidation only to layers, which contain only one metallic component, whose surface has formed under vacuum conditions (i.e. surfaces of full materials), and which have previously been exposed to the atmosphere, was not tested.

In a first test, therefore, the method of reactive cathodic arc deposition was used to provide surface regions of specimens made of cold work steel (90MnCrV8, 1.2842) with a coating of Al—Cr—O and these were compared to the uncoated regions on the same specimen after being aged in the atmosphere at 500° C. for 100 h. The results have already been discussed above and it was surprising that the coated region of the steel substrate could be very effectively protected from an oxide growth and therefore also from oxygen diffusion. Despite the comparatively low aging temperature (dictated by the steel material), the effect of the Al—Cr—O protective oxide is clearly visible. This effect exists even though this steel material also contains elements other than Fe, for example Cr, C, Si, Mn, and/or V. This example, however, also clearly demonstrates that the oxides that form on the uncoated regions do not offer any protection from oxidation. The temperature up to which the protective action of the Al—Cr—O remains, however, was unclear.

Consequently, aging experiments were carried out on intermetallic compounds and on high-temperature alloys. The set of problems that the oxidation of these materials involves, namely the selective oxide growth, has already been explained above. The coating with an oxide layer based on the metallic elements was proposed as a first embodiment. For technical reasons relating to the process, such an embodiment has many advantages. It turned out to be disadvantageous, however, that in certain temperature ranges, multiphase oxides can still result in mechanical failure particularly if a completely oxidized layer is not present (splashes in the layer). The oxidation behavior was then tested at higher aging temperatures in order to accelerate both the oxidation and diffusion processes.

4. Example: Oxidation of an Inconel Surface

A substrate made of Inconel was selected for the aging tests. This material is known as a high-temperature alloy and is essentially composed of Ni and Cr; with regard to the Ni and Cr, the composition can vary and in addition, other alloying elements can be added. FIG. 5 shows the XRD spectrum of this Inconel alloy. In addition to the measured XRD spectrum, the positions of the Bragg reflections are also shown for a Ni0.6Cr0.2 compound, which are listed under reference PDF 65-6291 for a Cr2Ni3 compound in the database (PDF-2, International Center for Diffraction Data, 12 Campus Boulevard, Newtown Square, Pa. 19073). A small shift in the angles is visible, which is explained by the fact that the Inconel alloy measured here differs from the reference by a few percent in terms of composition. This fact, however, is not important for further explanations or testing. Aside from the Bragg reflections for Inconel, no additional peaks are visible. This substrate was then aged in the atmosphere in a furnace at 900° C. for 24 h. After this aging, an XRD measurement of the substrate surface was carried out. This is shown in FIG. 6. The XRD spectrum differs significantly from the one in FIG. 5. In addition to the Inconel peaks (Cr2Ni3, PDF 65-6291), other reflections are observed, which can be attributed to different oxide phases that have formed spontaneously during the aging. The formation of the eskolaite phase of Cr2O3 (PDF 38-1479) and the NiCr2O4 phase (PDF 23-1272) as well as NiO2 (PDF 89-8397) are clearly visible. The measurements clearly show that oxide phases form on the surface of the Inconel, which are different from the expected, spontaneously occurring selective oxidation of the metallic components. These oxide phases are necessarily accompanied by an erosion of the surface of the substrate material since they grow with different impermeabilities and at different speeds.

In other experiments, it is then necessary to test the advantageous effect of the layer according to the invention, which also avoids the disadvantages that are present in oxides "of a similar type." To that end, an Al—Cr—O layer approximately 2 µm thick was deposited on the Inconel substrate. As an adaptation to the substrate, a thin Cr-containing layer was sought, it being also possible to select other Interfaces. The coated surface was once again tested by means of XRD. This measurement is shown in FIG. 7. In addition to the already known characteristic peaks for the Inconel substrate material (PDF 65-6291), this figure also shows the reflections from the database for the Cr2O3 eskolaite (PDF 38-1479) and the aluminum oxide (corundum) (PDF 46-1212). Since the Al—Cr—O layer was synthesized from a target material that was composed of 70 at. % Al and 30 at. % Cr, a layer is expected that has essentially one solid solution oxide in a corundum structure, i.e. whose Bragg reflections lie exactly between those of eskolaite and corundum. This can be observed in at least three positions: 2Theta approximately equal to 42.5°, 45°, and 65.5°. These peaks are broadened, which indicates a smaller crystallite size. This can be influenced by means of process parameters.

This coated Inconel substrate was then aged in the atmosphere at 900° C. in the furnace for 24 h. The XRD analyses of this layer produced after the aging are shown in FIG. 8. In addition to the peaks of the Inconel and the above-described peaks of Al—Cr—O solid solutions, additional peaks of the solid solution are formed, namely at 2Theta angles of approximately 25°, 34.5°, and 37° and in the vicinity of 65°. This indicates a larger crystallite size, which has been promoted by the high aging temperature. There is no change, however, visible in the crystal structure. There is also no suggestion of the oxide phases that had formed on the Inconel in the uncoated state during the aging. The following can therefore be ascertained:

The Al—Cr—O layer essentially with a corundum structure, i.e. a monophasic crystal structure, protects Inconel from a spontaneous and thus selective oxidation of the two metallic, components Al and Cr.

This behavior also indicates that Al—Cr—O in a predominantly solid solution structure is an outstanding diffusion barrier for oxygen.

The Al—Cr—O layer remains monophasic even when heated to 900° C. The only thing that happens is an increase in crystallite size.

This example is typical for the oxide barrier effect of Al—Cr—O in solid solution structure. This protective action exists for all of the alloys and intermetallic compounds mentioned at the beginning and has been verified both for the protection of surfaces composed of full material and for alloys and intermetallic compounds that have been synthesized as layers. The outstanding protection is ensured for Al/Cr ratios that result in the solid solution structure during the synthesis of an oxide layer. This applies to a fraction in the range from approximately less than or equal to 70 at. % Al, i.e. for Al/Cr ratios ≤2.3. This range can be expanded up to approximately 80 at. % Al by adapting certain parameters of the coating method. For the range of the higher Al content, the synthesized oxide layer is at least partially composed of an aluminum oxide phase and a chromium oxide phase, i.e. is at least biphasic. Since the fraction of Al is very high, though, a good surface oxide can nevertheless be produced through selective oxidation, but this is accompanied by the disadvantages that have already been discussed above for the multiphase system in the oxide formation. Furthermore, a thin oxide layer in a corundum structure with a large fraction of Al or exclusively composed of Al can form on the surface of the solid solution structure. But this does not weaken the material system since an aluminum oxide of this kind likewise forms in the corundum structure at high forming temperatures and is therefore compatible with the Al—Cr—O base.

5. Example: Oxidation Behavior of Splashes

Al—Cr—O, provided that it is deposited as a solid solution in a corundum structure, is very stable with regard to its crystal structure. It is nonetheless surprising that the barrier effect for oxygen is so good. As mentioned at the beginning, the layers were produced by means of reactive cathodic arc deposition. One feature of this coating technology is the splashes that are produced during the vaporization and partially incorporated into the deposited layer. The splash formation is promoted even more if the Al—Cr—O layer is not produced with single-element targets, i.e. with the use of elementary Al and Cr targets, but instead uses targets that contain both elements, i.e. for example Al—Cr targets with a ratio of 70 at. % Al and 30 at. % Cr. These can be targets that are produced either through powder metallurgy or through smelting metallurgy, i.e. the elements in these targets does not absolutely have to be in elementary form, but can instead also be in the form of intermetallic compounds or solutions. The analyses of the layers, which are synthesized in this way by means of reactive cathodic arc deposition, thus generally, in addition to the actual Al—Cr—O layer, also exhibit splashes that are incorporated into the layer (FIG. 9). The "core" of the splashes is composed of predominantly Cr or predominantly Al. The splash cores have a metallic character and due to their large size, are not completely oxidized. In the two dominant splashes in the middle of the figure, the EDX analysis reveals the cores of the splashes to be essentially composed of Cr (original splash in the photo shown inside the circle). In the SEM fracture cross-section, it is also clear that these splashes are incorporated into the approximately 2.2 µm thick Al—Cr—O layer, which has been deposited on a hard metal substrate. Except for the splashes, with regard to the metallic components, the Al—Cr—O layer has essentially the same chemical composition as is present in the target. The figure likewise shows that the layer also grows on the splashes. But it is also evident that despite the layer growth, clear boundaries are visible between the layer and splashes, at which boundaries a diffusion could take place. The splashes, which are not completely oxidized, could therefore be a problem if the intent were to produce an impermeable barrier layer for oxygen. But since the experiments specifically showed that the Al—Cr—O layers have excellent barrier properties, an explanation for this behavior was sought.

To that end, the Al—Cr—O layer from FIG. 9 was aged for 24 h at 900° C. Then the fracture cross-section was once again inspected under the scanning electron microscope. FIG. 10 shows the image of the fracture cross-section of the Al—Cr—O layer. On a very enlarged scale, the figure shows a splash with a layer that has grown over it (splash core once again circled). After the aging, the boundaries between the splash and the layer have disappeared, at least in the upper part, i.e. an intimate bond forms between the Al—Cr—O layer and the part of the layer that grows over the splash. If one recalls FIG. 1, in which the increase in volume of the steel due to the spontaneous oxidation thereof was observed in the unprotected region, and this is also applied to the oxidation of splashes or to splashes over which layers have grown in the Al—Cr material range, then it is possible to comprehend the mechanism of the automatic self-sealing of the splashes. In other words, if boundaries are permeable to an oxygen diffusion, then they are sealed with the increase in volume during the oxide growth. The large and clearly important difference from the usual oxide growth on other material systems is that the spontaneously growing oxide layer forms as a solid solution in a corundum structure or in borderline cases of pure metal, likewise forms in the corundum structure.

This permits the conclusion to be drawn that on metallic splashes, which are contained in an oxide solid solution structure that is temperature-stable (with regard to its crystal structure) and which with spontaneous oxidation, automatically form a crystal structure of the oxide that has the same crystal structure of the solid solution structure, it is possible to observe the self-sealing mechanism, which contributes to the outstanding barrier properties for oxygen diffusion.

Specifically, the present invention discloses a method for producing an oxidation barrier layer on a workpiece substrate in which the oxidation barrier layer is produced by means of physical deposition from the gas phase (PVD) and is an oxide that is materially related to the uncoated surface of the workpiece.

Preferably, the PVD method is a cathodic arc deposition method.

Preferably, the method is carried out in such a way that the oxidation barrier layer includes an Al—Cr—O layer.

The PVD method that is used according to the present invention for producing the oxidation barrier layer can be a cathodic arc deposition method, which is carried out in such a way that the deposited oxidation barrier layer includes splashes.

A method according to the present invention can also include a step in which the synthesized oxide layers undergo a post-oxidation in the plasma or another post-oxidation.

At the same time, the present invention also discloses a workpiece substrate with an oxidation barrier layer that is produced by means of PVD; the oxidation barrier layer is an oxide that is materially related to the uncoated surface of the workpiece. According to preferred embodiments of the present invention, this oxide layer, as explained above, can contain splashes and/or at least one Al—Cr—O layer.

The invention claimed is:

1. A method for producing an oxidation barrier layer on a workpiece substrate, comprising:

producing an oxygen-impermeable oxidation barrier layer on an uncoated surface of the workpiece substrate in order to avoid oxidation of deeper substrate regions thus preventing the occurrence of density changes in deeper regions of the substrate;

using a physical deposition method from a gas phase (PVD) to produce the oxidation barrier layer, wherein the workpiece comprises at least one of the group consisting of an alloy, an intermetallic compound, and a solid solution, and the oxidation barrier layer is an oxide that is materially related to the uncoated surface of the workpiece, so that the oxide comprises the same metallic components that are also found in the uncoated surface, and the oxide layer grows without additional external cause or stimulus and forms as a solid solution in a corundum structure thereby causing the oxidation barrier layer to be self-sealing with regard to oxygen diffusion, wherein the oxidation barrier layer includes splashes, which are not completely oxidized, and wherein the oxidation barrier layer also grows on the splashes and, despite the layer growth, clear boundaries are visible between the oxidation barrier layer and the splashes, at which boundaries a diffusion could take place; and exposing the coated workpiece substrate to a temperature of at least 800° C. while the oxidation barrier layer remains mechanically stable in an oxidizing environment and reduces or prevents oxygen diffusion into the substrate.

2. The method according to claim 1, wherein the PVD method is a cathodic arc deposition method.

3. The method according to claim 1, wherein the oxidation barrier layer includes an Al—Cr—O layer.

4. The method according to claim 1, further comprising subjecting the oxidation barrier layer to a post-oxidation in plasma or another post-oxidation.

5. A workpiece substrate with an oxidation barrier layer produced by PVD, comprising;

an oxygen-impermeable oxidation barrier layer on the workpiece substrate that avoids oxidation of deeper substrate regions thus preventing the occurrence of density changes in deeper regions of the substrate, wherein the workpiece comprises at least one of the group consisting of an alloy, an intermetallic compound, and a solid solution, and the oxidation barrier layer is an oxide that is materially related to an uncoated surface of the workpiece, the oxide comprises the same metallic components that are also found in the uncoated surface, and the oxide layer grows without additional external cause or stimulus and forms as a solid solution in a corundum structure thereby causing the oxidation barrier layer to be self-sealing with regard to oxygen diffusion, wherein the oxidation barrier layer includes splashes, which are not completely oxidized, and wherein the oxidation barrier layer also grows on the splashes and, despite the layer growth, clear boundaries are visible between the oxidation barrier layer and the splashes, at which boundaries a diffusion could take place; and wherein the oxidation barrier layer remains mechanically stable in an oxidizing environment at a temperature of at least 800° C. and reduces or prevents oxygen diffusion into the substrate.

6. The method according to claim 3, further comprising subjecting the oxidation barrier layer to a post-oxidation in plasma or another post-oxidation.

7. The method according to claim 1, wherein the oxidation barrier layer comprises Al—Hf—O.

8. The method according to claim 1, wherein the alloy is selected from high temperature alloys.

9. The method according to claim 8, wherein the high temperature alloys comprise Ni-based alloys.

10. The method according to claim 8, wherein the high temperature alloys are added with alloying and doping elements, which A contribute to solidification.

11. The method according to claim 10, wherein the alloying is carried out with at least one of the group consisting of Al, Si, Cr, and rare earths.

* * * * *